(12) United States Patent
Fischer et al.

(10) Patent No.: US 7,243,551 B2
(45) Date of Patent: Jul. 17, 2007

(54) MICROMECHANICAL COMPONENT HAVING A SEALED CAVITY AND AT LEAST TWO DIELECTRIC LAYERS AND CORRESPONDING METHOD FOR ITS MANUFACTURE

(75) Inventors: Frank Fischer, Gomaringen (DE); Arnim Hoechst, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 11/023,121

(22) Filed: Dec. 21, 2004

(65) Prior Publication Data

US 2005/0193827 A1   Sep. 8, 2005

(30) Foreign Application Priority Data

Mar. 3, 2004   (DE) ............... 10 2004 010 295

(51) Int. Cl.
*G01L 9/00* (2006.01)
(52) U.S. Cl. .................................. 73/754
(58) Field of Classification Search .......... 73/754, 73/777
See application file for complete search history.

(56) References Cited

U.S. PATENT DOCUMENTS

| | | | | |
|---|---|---|---|---|
| 5,417,115 A | * | 5/1995 | Burns | 73/778 |
| 5,834,334 A | * | 11/1998 | Leedy | 438/107 |
| 5,869,767 A | * | 2/1999 | Hayward et al. | 73/774 |
| 6,278,167 B1 | * | 8/2001 | Bever et al. | 257/415 |
| 6,294,909 B1 | * | 9/2001 | Leedy | 324/207.17 |
| 6,426,239 B1 | * | 7/2002 | Gogoi et al. | 438/53 |
| 6,523,392 B2 | | 2/2003 | Porter et al. | |
| 6,912,759 B2 | * | 7/2005 | Izadnegahdar et al. | 29/25.35 |
| 6,936,902 B2 | * | 8/2005 | Reichenbach et al. | 257/415 |
| 6,943,485 B2 | * | 9/2005 | Sumi | 310/357 |
| 7,178,403 B2 | * | 2/2007 | Kurtz | 73/754 |

FOREIGN PATENT DOCUMENTS

| | | |
|---|---|---|
| DE | 10053326 | 5/2002 |
| DE | 10117486 | 10/2002 |

\* cited by examiner

*Primary Examiner*—Max Noori
(74) *Attorney, Agent, or Firm*—Kenyon & Kenyon LLP

(57) ABSTRACT

A micromechanical component having a substrate, a cavity formed in the substrate, a membrane provided on the surface of the substrate, which seals the cavity, the membrane having at least two layers between which one or several piezoelectric or piezoresistive circuit trace strip(s) is/are embedded, and a corresponding manufacturing method therefor.

11 Claims, 3 Drawing Sheets

MICROMECHANICAL COMPONENT HAVING A SEALED CAVITY AND AT LEAST TWO DIELECTRIC LAYERS AND CORRESPONDING METHOD FOR ITS MANUFACTURE

FIELD OF THE INVENTION

The present invention relates to a micromechanical component, and also relates to a corresponding manufacturing method.

BACKGROUND INFORMATION

The structure of piezoelectric or piezoresistive pressure sensors today is based exclusively on the use of monocrystalline silicon membranes into which piezoelectric resistors are introduced using doping technology. In particular, the piezoelectric or piezoresistive circuit traces may be formed in the silicon layer of an SOI substrate.

Overall, these manufacturing methods may be expensive and complicated.

SUMMARY OF THE INVENTION

Although applicable to any number of micromechanical components and structures, particularly sensors and actuators, the present invention (as well as its basic underlying problem) definition are explained with reference to a piezoelectric or piezoresistive pressure sensor.

The micromechanical component of the present invention, and the manufacturing method of the present invention have the advantage of allowing simple manufacturability.

One advantage of the present invention is that a piezoelectric or piezoresistive sensor, in particular a pressure sensor, is provided with a dielectric membrane and monocrystalline piezoelectric resistors, using surface micromechanic technology.

In the method according to the present invention or the micromechanical component according to the present invention, piezoelectric or piezoresistive circuit traces are defined by being patterned out of a layer of the circuit-trace material, which is separated from a substrate by an intermediate layer.

A membrane layer is then deposited above the piezoelectric or piezoresistive circuit traces and etching access to the substrate is created. By selective removal of a substrate area underneath the membrane, a cavity is produced which will be sealed again in a later step, a predefined reference pressure being able to be enclosed.

A micromechanical component according to the present invention has a membrane that has at least two layers between which one or several piezoelectric or piezoresistive circuit trace strip(s) are embedded. The piezoelectric or piezoresistive circuit trace strips may be made of monocrystalline silicon. A reference pressure may be enclosed in the cavity, the substrate having the form of a tub.

According to an exemplary embodiment, the piezoelectric or piezoresistive circuit trace strip(s) is/are at least partially arranged above the hollow cavity.

According to another exemplary embodiment, the piezoelectric or piezoresistive circuit trace strip(s) is/are arranged above or near an edge region of the hollow cavity. According to another exemplary embodiment, the two layers are made of an insulating material and the piezoelectric or piezoresistive circuit trace strip(s) is/are made of a monocrystalline material.

According to another exemplary embodiment, the piezoelectric or piezoresistive circuit trace strip(s) is/are connected by means of a contacting device, which extends through the upper layer of the membrane.

According to another exemplary embodiment, the membrane has a lowest first layer, a second-lowest second layer, a third-lowest third layer and an uppermost fourth layer, the piezoelectric or piezoresistive circuit trace strip(s) being embedded between the first and the second layer, the third layer being made of a permeable material, and the fourth layer being produced in such a way that it hermetically seals the third layer.

According to another exemplary embodiment, the first and second layers have at least one through-hole above the hollow cavity, the at least one through-hole being sealed by the third and fourth layers.

DETAILED DESCRIPTION

Figure 1A:
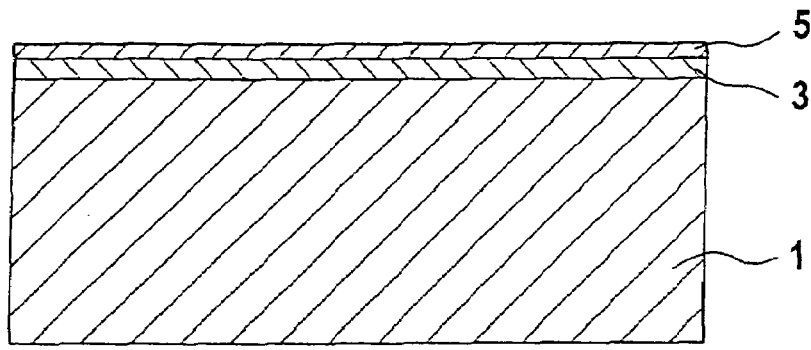
FIG. 1a shows a schematic cross-sectional view of the essential manufacturing steps of a micromechanical component according to an exemplary embodiment and/or exemplary method of the present invention.

In the figures, identical reference numbers designate the same or functionally comparable or corresponding components. According to FIG. 1a, the starting point of the process sequence according to the exemplary embodiment of the present invention is an SOI substrate stack, which includes a monocrystalline silicon substrate 1, a superposed silicon oxide layer 3 and a monocrystalline silicon layer 5 being situated above. Such an SOI substrate stack may be produced by various manufacturing processes known from the related art and can be purchased from the manufacturer in large quantities at the required quality. According to this specific embodiment, the SOI substrate stack may also be already preprocessed with IC circuit elements prior to the start of the process sequence, so that the sensor is able to be integrated into a circuit environment. It is only useful that the region where a membrane and piezoelectric resistors will later be formed is not interrupted by circuit elements.

Figure 1B:
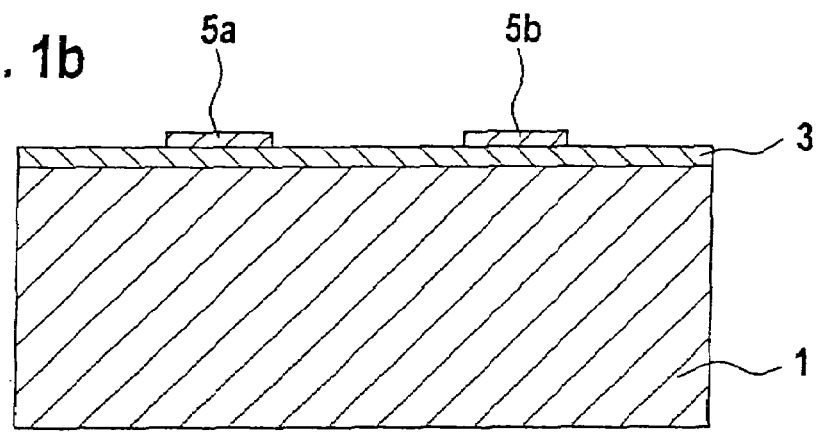
FIG. 1b shows another schematic cross-sectional view of the essential manufacturing steps of a micromechanical component according to an exemplary embodiment and/or exemplary method of the present invention.

Additionally, with reference to FIG. 1b, piezoelectric or piezoresistive circuit trace strips 5a, 5b are patterned in monocrystalline silicon layer 5 as subsequent strain gauges in a first process step. The resistance of circuit trace strips 5a, 5b is able to be adjusted via their lateral geometry, the layer thickness of layer 5 and via the doping of layer 5. The etching procedure for patterning circuit trace strips 5a, 5b selectively stops on silicon oxide layer 3, which expediently has a thickness of approximately 5 to 500 nm. A practical layer thickness for layer 5 is between 100 and 1000 nm.

Figure 1C:
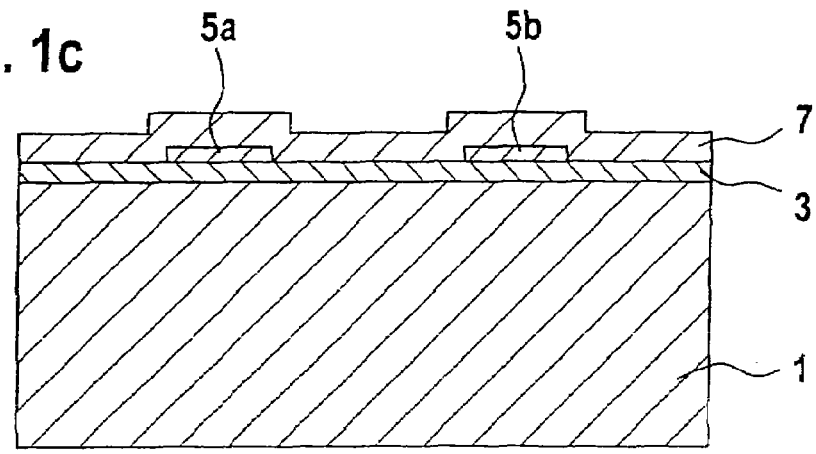
FIG. 1c shows another schematic cross-sectional view of the essential manufacturing steps of a micromechanical component according to an exemplary embodiment and/or exemplary method of the present invention.

Furthermore, with reference to FIG. 1c, at least one dielectric layer 7 is deposited above piezoelectric or piezoresistive circuit trace strip 5a, 5b and the exposed regions of layer 3. This layer 7 assumes the supporting function of a membrane M (cf. FIG. 1g) and should therefore be under tensile stress in order to prevent uncontrolled arching. It is especially preferred to provide a layer 7 of LPCVD silicon nitride, which has a thickness of between 100 and 300 nm.

Figure 1D:
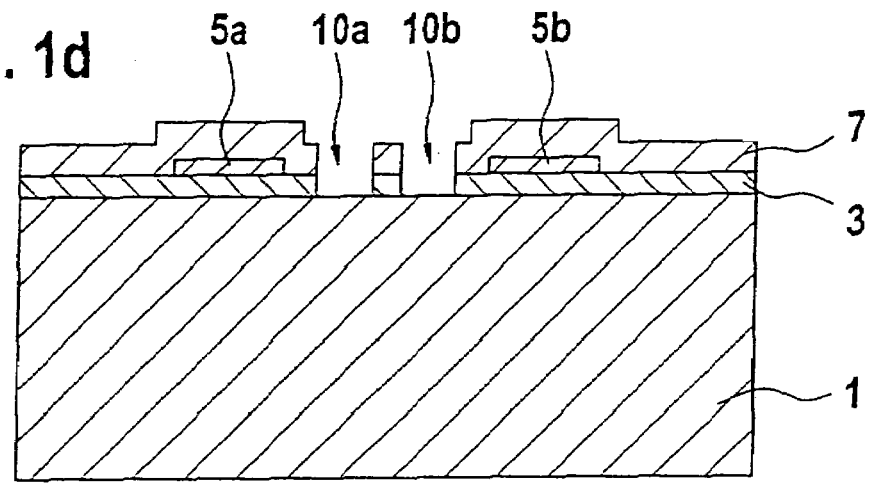
FIG. 1d shows another schematic cross-sectional view of the essential manufacturing steps of a micromechanical component according to an exemplary embodiment and/or exemplary method of the present invention.

In a subsequent process step, which is illustrated in FIG. 1d, layers 3 and 7 are patterned with through-holes 10a, 10b by an etching process, through-holes 10a, 10b lying between piezoelectric or piezoresistive circuit-trace strips 5a, 5b. Both an anisotropic, one-stage etching process and a selective anisotropic, two-stage etching process may be used as etching process.

Figure 1E:
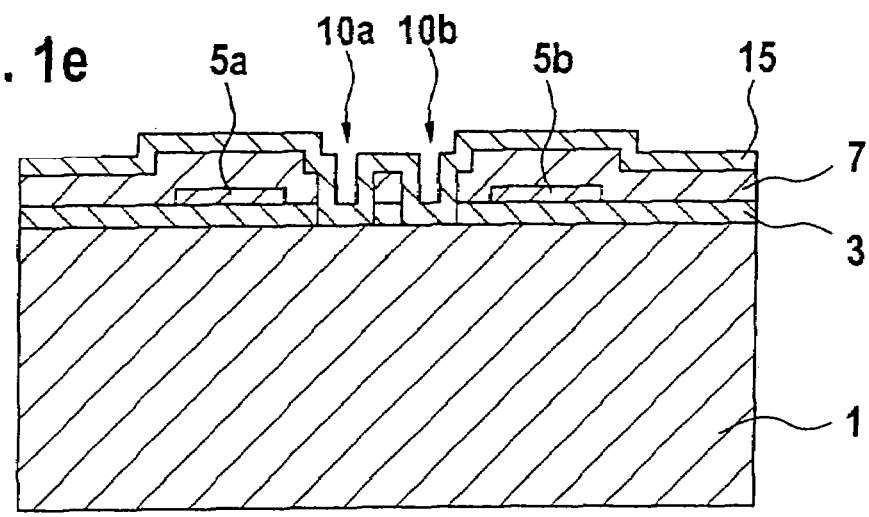
FIG. 1e shows another schematic cross-sectional view of the essential manufacturing steps of a micromechanical component according to an exemplary embodiment and/or exemplary method of the present invention.

In a subsequent process step, which is illustrated in FIG. 1e, a permeable, porous layer 15 is deposited across the entire surface above the resulting structure. Permeable layer 15 is penetratable by a predefined etching agent, such as an etching gas, and reduces the effective cross section of through-holes 10a, 10b. This not only considerably increases the etching rate in a subsequent ClF3 etching step, but also provides for easily resealing the nanopatterned pore structure of layer 15 at a later point utilizing a CVD process. Permeable layer 15 may also be a dielectric.

The following, for example, may be used for permeable layer 15: 10 to 200 nm thin PECVD oxide on silane basis (SiH$_4$) with O$_2$, N$_2$O or other oxidation agents, 10 to 200 nm thin PECVD or LPCVD silicon nitride. The desired permeability of the nitride is able to be obtained by an appropriate aftertreatment, for instance in that the nitride is subsequently converted—completely or partially—to silicate such as SiF$_6$ (NH$_4$)$_2$ under hydrogen fluoride (HF), which is permeable as continuous layer. Furthermore, 10 to 200 nm thin polymer films from a plasma deposition such as aluminum fluoride may be used as material for layer 15, or organic compounds, for instance from C$_4$F$_8$ processes or similar thin, sputtered or vapor-deposited metals such as gold, aluminum, AlSiCu etc. When AlSiCu is used, the selective solving out of silicon and copper deposits may be used to produce micro-porosity.

Finally, photoresists with a silicon portion in the polymer chain, BCB (butyl cyclobutane) porous dielectric layers from vapor deposition or centrifugal processes may be used as material for permeable layer 15.

Finally, permeable layer 15 may be formed as cover layer by deposition of two different polymers, which are dissolved in a common or in (a) different solvent(s), whereupon the one or plurality of solvents is evaporated and one of the two polymers is selectively removed from the other from the formed layer.

Figure 1F:
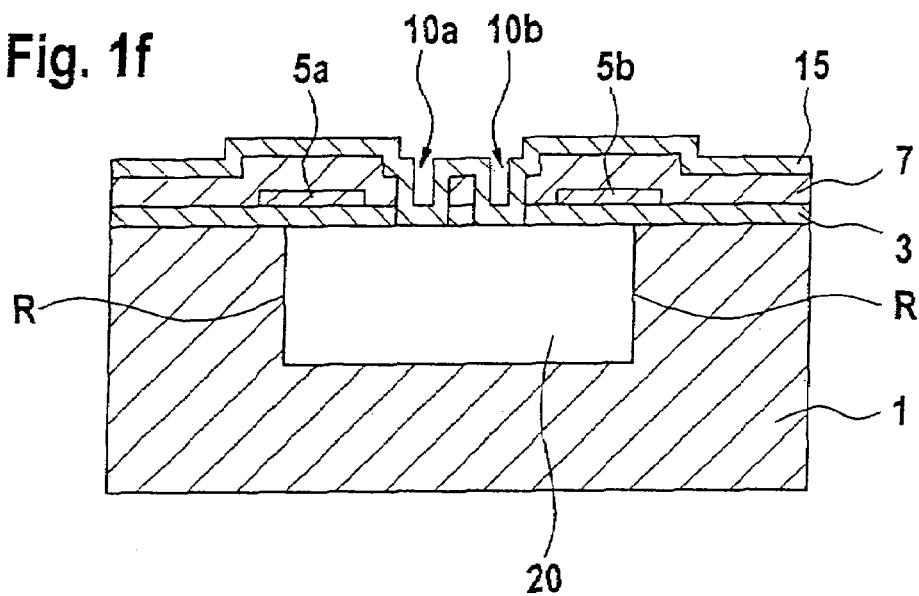
FIG. 1f shows another schematic cross-sectional view of the essential manufacturing steps of a micromechanical component according to an exemplary embodiment and/or exemplary method of the present invention.
Figure 1G:
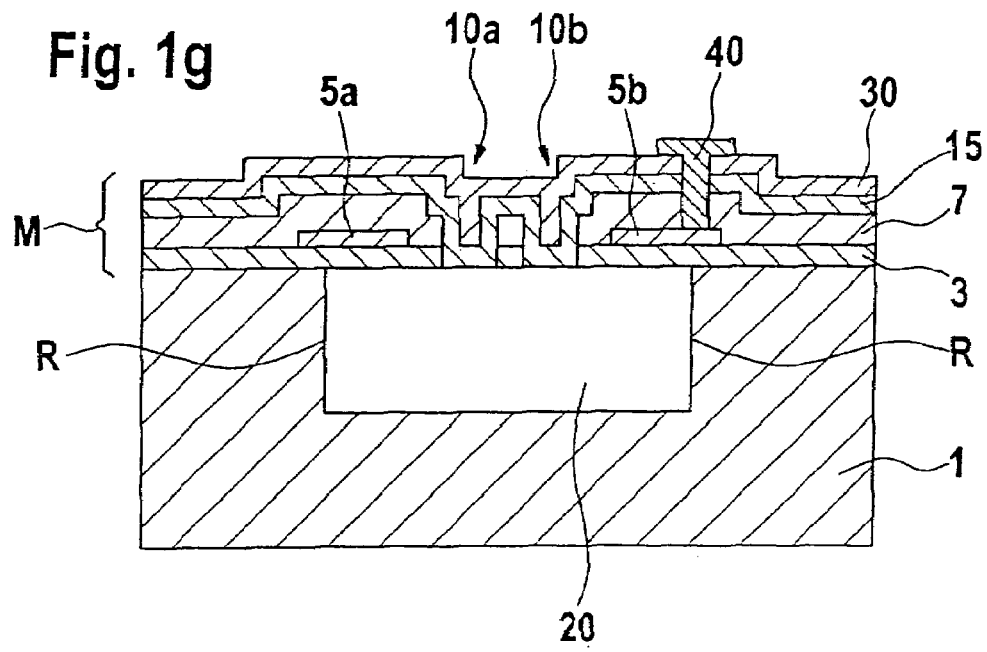
FIG. 1g shows another schematic cross-sectional view of the essential manufacturing steps of a micromechanical component according to an exemplary embodiment and/or exemplary method of the present invention.

Furthermore, with reference to FIG. 1f, substrate 1 is now selectively removed with respect to dielectric layers 3, 7 and 15 by a ClF$_3$ etching step or some other gas etching step that spontaneously etches silicon. In the process, a cavity 20 is produced which is able to be controlled in its lateral and vertical extension in a satisfactory manner. The control of the etching front is simple, in particular when the edge region R of cavity 20 is suitably oriented with respect to particular crystal directions of silicon substrate 1 since this provides for forming smooth etching fronts. An orientation of the edge region of cavity 20 may be in parallel to the (100) surfaces. The geometry of the cavity is defined by the arrangement of through-holes 10a, 10b.

Piezoelectric or piezoresistive circuit trace strips 5a, 5b may be arranged in such a way that they lie above the edge region of cavity 20 since the greatest deformation occurs at the particular edge, that is, the subsequent sensor signal or the sensor sensitivity is at a maximum. After etching of cavity 20, permeable layer 15 is sealed by at least one further dielectric layer 30 according to FIG. 1g. Layer 30 in turn may be under tensile stress or receives the tensile stress of layer stack 3, 7, 15, 30, which together forms membrane M.

The deposition of dielectric layer 30 may be implemented in a PVD or CVD process during which a defined process pressure prevails, so that a reference pressure may be enclosed below the membrane. The material of dielectric layer 30 may be PECVD-TEOS or thermal TEOS, PECVD-silane oxide, PECVD nitride or a similar material, for instance. Finally, with reference to FIG. 1g, piezoelectric or piezoresistive circuit trace strips 5a, 5b are contacted via a contacting device 40, for example a Wolfram contact provided in a contact hole.

Piezoelectric circuit trace strips 5a, 5b are able to be connected to parts of the evaluation circuit or bond pads via this contacting device 40.

Although the present invention was described above in light of the exemplary embodiments, it is not so restricted to it, but is able to be modified in various ways.

In particular, any micromechanical basic materials such as germanium, may be used and not only the silicon substrate which was cited as an example.

Likewise, a variety of sensor structures and not only the illustrated pressure sensor may be formed. Instead of ClF$_3$, XeF$_2$ or BrF$_3$ may be used as etching agents.

The reference numeral list is as follows:
1 Silicon wafer substrate;
3 Silicon oxide layer;
5 Monocrystalline silicon layer;
5a, 5b Piezoelectric circuit trace strips;
7 Silicon nitride layer;
10a, 10b Through holes;
15 Permeable layer;
20 Cavity;
R Edge area;
M Membrane;
30 TEOS layer; and
40 Contacting device.

What is claimed is:

1. A micromechanical component comprising:
a substrate; and
a membrane provided on a surface of the substrate, the membrane having at least two dielectric layers between which at least one piezoelectric or piezoresistive circuit trace strip is embedded,
wherein the substrate and the membrane are arranged to seal a cavity.

2. The micromechanical component of claim 1, wherein the at least one piezoelectric or piezoresistive circuit trace strip is at least partially arranged above the cavity.

3. The micromechanical component of claim 1, wherein the at least one piezoelectric or piezoresistive circuit trace strip is arranged over or in a vicinity of an edge region of the cavity.

4. The micromechanical component of claim 1, wherein the at least two layers are made from an insulating material and the at least one piezoelectric or piezoresistive circuit trace strip is made from a monocrystalline material.

5. The micromechanical component of claim 1, wherein the at least one piezoelectric or piezoresistive circuit trace strip is connected by a contacting device that extends through an upper layer of the membrane.

6. The micromechanical component of claim 1, wherein the membrane includes a lowest first layer, a second-lowest second layer, a third-lowest third layer and an uppermost fourth layer, the at least one piezoelectric or piezoresistive circuit trace strip being embedded between the first and the second layers, wherein the third layer is made of a permeable material, and wherein the fourth layer is produced so that it hermetically seals the third layer.

7. The micromechanical component of claim 6, wherein the first and second layer have above the cavity at least one through hole which is sealed by the third layer and the fourth layer.

8. The micromechanical component of claim 1, wherein the micromechanical component is a surface micromechanic component.

9. The micromechanical component of claim 1, wherein the substrate together with the cavity form a trough.

10. The micromechanical component of claim 1, wherein at least one layer of the at least two dielectric layers of the membrane is arranged to have a tensile stress.

11. The micromechanical component of claim 6, wherein the fourth layer is arranged to have a tensile stress.

* * * * *